United States Patent
Ide et al.

(10) Patent No.: US 7,502,210 B2
(45) Date of Patent: Mar. 10, 2009

(54) CPP MAGNETIC DETECTING DEVICE CONTAINING NIFE ALLOY ON FREE LAYER THEREOF

(75) Inventors: Yosuke Ide, Niigata-ken (JP); Masamichi Saito, Niigata-ken (JP); Masahiko Ishizone, Niigata-ken (JP); Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 464 days.

(21) Appl. No.: 11/365,697

(22) Filed: Feb. 28, 2006

(65) Prior Publication Data
US 2006/0198062 A1    Sep. 7, 2006

(30) Foreign Application Priority Data
Mar. 3, 2005    (JP)    ............... 2005-058742

(51) Int. Cl.
*G11B 5/127* (2006.01)
(52) U.S. Cl. ............................................. 360/324.12
(58) Field of Classification Search ............ 360/324.12, 360/324.1, 324.11, 319; 29/603.01
See application file for complete search history.

(56) References Cited

U.S. PATENT DOCUMENTS

| | | | | |
|---|---|---|---|---|
| 5,992,004 A | * | 11/1999 | Sato et al. ............... | 29/603.14 |
| 6,157,524 A | * | 12/2000 | Nakazawa et al. ..... | 360/324.12 |
| 6,661,624 B1 | * | 12/2003 | Nagasaka ............... | 360/324.12 |
| 6,929,959 B2 | * | 8/2005 | Nishiyama et al. ............. | 438/3 |
| 7,029,771 B2 | * | 4/2006 | Hasegawa et al. ........ | 428/811.5 |
| 7,079,362 B2 | * | 7/2006 | Hasegawa ............... | 360/324.12 |
| 7,150,092 B2 | * | 12/2006 | Hasegawa ................ | 29/603.09 |
| 7,333,306 B2 | * | 2/2008 | Zhao et al. ............. | 360/324.12 |
| 2001/0009063 A1 | * | 7/2001 | Saito et al. ............... | 29/603.08 |
| 2003/0184925 A1 | | 10/2003 | Hasegawa et al. | |

FOREIGN PATENT DOCUMENTS

| | | |
|---|---|---|
| JP | 2002-204010 | 7/2002 |
| JP | 2003-298139 | 10/2003 |
| JP | 2004-039941 | 2/2004 |

* cited by examiner

*Primary Examiner*—Allen T Cao
(74) *Attorney, Agent, or Firm*—Brinks Hofer Gilson & Lione

(57) ABSTRACT

A magnetic detecting device having a large ΔRA value is provided. A free magnetic layer has a three layer structure in which a CoFe layer, a $Ni_aFe_b$ alloy layer (here, a and b are represented by at %, and satisfy the relationship of $47 \leq a \leq 77$ and $a+b=100$), and a CoFe layer are laminated.
In addition, pinned magnetic layers have heusler alloy layers, which are made of a heusler alloy such as a $Co_2MnGe$ alloy. Accordingly, the product ΔRA of a magnetic resistance variation ΔR of the magnetic detecting device and an area A of the device can have a value of 5 mΩμm² more.

7 Claims, 5 Drawing Sheets

CPP MAGNETIC DETECTING DEVICE CONTAINING NIFE ALLOY ON FREE LAYER THEREOF

BACKGROUND OF THE INVENTION

1. Field of the Invention

The present invention relates to a CPP (current perpendicular to the plane) magnetic detecting device in which a sense current flows in the direction perpendicular to the plane, and more particularly, to a magnetic detecting device in which a product of a magnetic resistance variation and an area of the device has a large value.

2. Description of the Related Art

FIG. 5 is a partial cross-sectional view showing a conventional magnetic detecting device (spin valve thin film device) taken along the direction parallel to a surface thereof facing a recording medium.

Reference numeral 1 shown in FIG. 5 indicates a base layer made of Ta, and a seed layer 2, which is made of a metal having a body centered cubic (bcc) structure, such as Cr, is formed on the base layer 1.

A multilayer film T in which an antiferromagnetic layer 3, a pinned magnetic layer 4, a nonmagnetic material layer 5, a free magnetic layer 6, and a protective layer 7 are laminated in this order, is formed on the seed layer 2.

The protective layer 7 is made of Ta, the nonmagnetic material layer 5 is made of Cu, each of the free magnetic layer 6 and the pinned magnetic layer 4 is made of a NiFe alloy, and the antiferromagnetic layer 3 is made of PtMn.

Electrode layers 10 are provided on the upper and lower sides of the multilayer film T, respectively, and a DC sense current flows in the direction perpendicular to the plane of each layer forming the multilayer film T3.

An exchange coupling magnetic field is generated at the interface between the antiferromagnetic layer 3 and the pinned magnetic layer 4, and thus the direction of magnetization of the pinned magnetic layer 4 is fixed in a height direction (Y direction in FIG. 5).

Hard bias layers 8 made of hard magnetic material such as CoPt are formed on both sides of the free magnetic layer 6, and the upper and lower portions and end portions of the hard bias layers 8 are insulated with insulating layers 9. The free magnetic layer 6 is uniformly magnetized in the track width direction (X direction in FIG. 5) by the longitudinal bias magnetic field, which is generated by the hard bias layers 8.

When an external magnetic field is applied to the magnetic detecting device shown in FIG. 5, the direction of magnetization of the free magnetic layer is changed with respect to that of the pinned magnetic layer. Accordingly, the resistance value of the multilayer film is changed. When a sense current having a predetermined current value flows, the change of the resistance value is detected by the change of the voltage, thereby detecting the external magnetic field.

There are many cases in which a permalloy having a weak magnetic property is used as a material of the free magnetic layer of the magnetic detecting device. In addition, an example of a magnetic detecting device having a free magnetic layer, which is made of a NiFe alloy other than the permalloy, is disclosed in JP-A-2002-204010 (seventh page).

The permalloy is a NiFe alloy containing 80 at % of Ni. Furthermore, as disclosed in paragraph [0023] in JP-A-2002-204010, the free magnetic layer is made of a $Ni_xFe_{(100-x)}$ alloy ($40 \leq x \leq 70$).

However, even if the free magnetic layer is made of the NiFe alloy within the above-mentioned composition range, it is difficult to increase the product $\Delta RA$ of a magnetic resistance variation of the CPP-GMR magnetic detecting device, in which a DC sense current flows in the direction perpendicular to the plane of each layer forming the multilayer film, and an area of the device to have a value of 5 m$\Omega\mu m^2$ or more, and it is not possible to obtain a practical regenerated output.

SUMMARY OF THE INVENTION

The invention has been made to solve the above-mentioned problems, and it is an object of the invention to provide a magnetic detecting device having a high regenerated output by offering the preferable conditions for forming a free magnetic layer.

According to the invention, a magnetic detecting device includes a multilayer film, which has at least one pinned magnetic layer magnetized in one direction and a free magnetic layer formed on the pinned magnetic layer with a nonmagnetic material layer therebetween, and in which a sense current flows in the direction perpendicular to the plane of each layer forming the multilayer film. In this case, the free magnetic layer includes a $Ni_aFe_b$ alloy layer (a and b are represented by at %, and satisfy the relationship of $47 \leq a \leq 77$ and a+b=100). Furthermore, the pinned magnetic layer includes a $Co_2YZ$ alloy layer (Y is one or more elements of Mn, Fe, and Cr, and Z is one or more elements of Al, Ga, Si, Ge, Sn, In, Sb, Pb, and Zn).

In the invention, the free magnetic layer includes a $Ni_aFe_b$ alloy layer, and the pinned magnetic layer includes a $Co_2YZ$ alloy layer. Accordingly, a CPP (current perpendicular to the plane)-GMR magnetic detecting device, in which a sense current flows in the direction perpendicular to the plane of each layer forming the multilayer film, can have a larger and more practical regenerated output than in the conventional CPP-GMR magnetic detecting device or the CIP (current in the plane)-GMR magnetic detecting device in which a sense current flows in the direction parallel to the plane of each layer forming the multilayer film.

Specifically, in the invention, a product $\Delta RA$ of a resistance variation $\Delta R$ of the magnetic detecting device and an area A of the device can have a value of 5 m$\Omega\mu m^2$ or more.

The magnetic detecting layer having a $\Delta RA$ value of 5 m$\Omega\mu$m 2 or more cannot be obtained only by forming the free magnetic layer by means of a NiFe alloy containing the content of Ni in the range of 40 to 80 at %. Furthermore, in the CIP-GMR magnetic detecting device that has been put to practical use so far, it has been not possible to obtain the regenerated output corresponding to the CPP-GMR magnetic detecting device having a $\Delta RA$ value of 5 m$\Omega\mu m^2$ or more.

In the invention, the free magnetic layer preferably has a three layer structure in which CoFe layers are laminated on the upper and lower sides of the $Ni_aFe_b$ alloy layer, respectively.

The magnetic detecting device of the invention is, for example, a top spin valve CPP-GMR magnetic detecting device in which the pinned magnetic layer is provided above the free magnetic layer.

Alternatively, the magnetic detecting device of the invention is, for example, a bottom spin valve CPP-GMR magnetic detecting device in which the pinned magnetic layer is provided below the free magnetic layer.

Furthermore, the magnetic detecting device of the invention is a dual spin valve CPP-GMR magnetic detecting device in which the nonmagnetic material layer and the pinned magnetic layer are provided below the free magnetic layer and another nonmagnetic material layer and another pinned magnetic layer are provided above the free magnetic layer. For example, an antiferromagnetic layer overlaps the pinned magnetic layer.

In the invention, the free magnetic layer includes a $Ni_aFe_b$ alloy layer (a and b are represented by atomic %, and satisfy the relationship of $47 \leq a \leq 77$ and $a+b=100$), and the pinned magnetic layer includes a $Co_2YZ$ alloy layer. Accordingly, a CPP-GMR magnetic detecting device, in which a sense current flows in the direction perpendicular to the plane of each layer forming the multilayer film, can have a larger and more practical regenerated output than in the conventional CPP-GMR magnetic detecting device or the CIP (Current In the plane)-GMR magnetic detecting device in which a sense current flows in the direction parallel to the plane of each layer forming the multilayer film.

In the invention, a product $\Delta RA$ of a resistance variation $\Delta R$ of the magnetic detecting device and an area $A$ of the device can have a value of 5 $m\Omega\mu m^2$ or more.

DESCRIPTION OF THE PREFERRED EMBODIMENT

Figure 1:
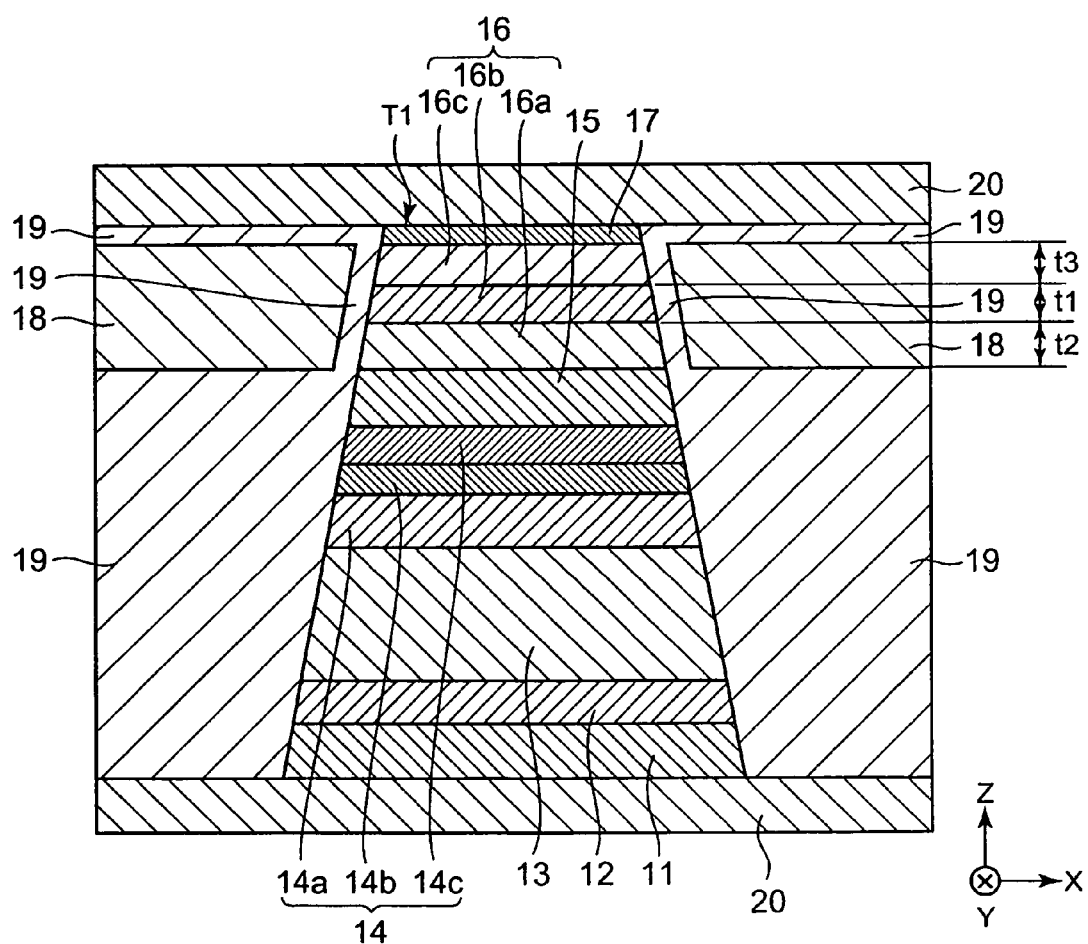
FIG. 1 is a cross-sectional view showing the structure of a magnetic detecting device (single spin valve magnetoresistive sensor) according to a first embodiment of the invention as seen from the surface thereof facing a recording medium.

FIG. 1 is a cross-sectional view showing the entire structure of a magnetic detecting device (single spin valve magnetoresistive sensor) according to a first embodiment of the invention, as seen from the surface thereof facing a recording medium. Furthermore, in FIG. 1, the device extending in the X direction is shown by a cross section at the only central portion thereof.

The single spin valve magnetoresistive sensor is provided to the trailing end portion of a floating slider, which is provided to a hard disk unit, and detects the recording magnetic field of a hard disk or the like. In addition, a magnetic recording medium such as a hard disk moves in the Z direction, and the leak magnetic field from the magnetic recording medium is formed in the Y direction.

The lowermost layer in FIG. 1 is a base layer, which is made of a nonmagnetic material such as one or more elements of Ta, Hf, Zr, Ti, Mo, and W. A multilayer film T1, which includes a sheet layer 12, an antiferromagnetic layer 13, a pinned magnetic layer 14, a nonmagnetic material layer 15, a free magnetic layer 16, and a protective layer 17, is laminated on the base layer 11. The magnetic detecting device shown in FIG. 1 is a so-called bottom spin valve GMR magnetic detecting device in which the antiferromagnetic layer 13 is provided below the free magnetic layer 16.

The sheet layer 12 is made of NiFeCr or Cr. When the sheet layer 12 is made of NiFeCr, the sheet layer 12 has a face centered cubic (fcc) structure and an equivalent crystal plane indicated as a {111} plane is preferentially oriented in the direction parallel to the plane. In addition, when the sheet layer 12 is made of Cr, the sheet layer 12 has a body centered cubic (bcc) structure and an equivalent crystal plane indicated as a {110} plane is preferentially oriented in the direction parallel to the plane.

Furthermore, although the base layer 11 has an almost amorphous structure, the base layer 11 may not be formed.

The antiferromagnetic layer 13 formed on the sheet layer 12 may be made of an antiferromagnetic material containing Mn and an element X (here, the element X is one or more elements of Pt, Pd, Ir, Rh, Ru, and Os).

The antiferromagnetic layer 13 has a face centered cubic (fcc) structure, or a face centered tetragonal (fct) structure.

An X—Mn alloy using platinum group elements has excellent characteristics of the antiferromagnetic material, which has an excellent corrosion resistance, a high blocking temperature, a large exchange coupling magnetic field (Hex), and the like. For example, a PtMn alloy or an IrMn, which are formed in a binary system, can be used as the X—Mn alloy.

Further, in the invention, the antiferromagnetic layer 13 may be made of an antiferromagnetic material containing Mn, the element X, and an element X' (here, the element X' is one or more elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements).

Moreover, an element, which is penetrated into the gap of the space lattice composed of the element X and Mn or is substituted with a part of lattice points of the crystal lattice composed of the element X and Mn, is preferably used as the element X'. Here, a solid solution means a solid in which ingredients are uniformly mixed.

In the invention, it is preferable that the content of the element X' be in the composition range of 0.2 to 10 at % (atomic %), and it is more preferable that the content of the element X' be in the composition range of 0.5 to 5 at %. Further, in the invention, it is preferable that the content of the element X be Pt or Ir.

In the invention, it is preferable that the content of the element X or elements X+X' of the antiferromagnetic layer 13 be set in the range of 45 to 60 at %. It is more preferable that the content of the element X or elements X+X' of the antiferromagnetic layer 13 be set in the range of 49 to 56.5 at %. Accordingly, in the process of forming a film, the interface between the antiferromagnetic layer and the pinned magnetic layer 14 is in the noncoherent state, and it is conjectured that the antiferromagnetic layer 13 causes an appropriate order transformation to occur by the heat treatment.

The pinned magnetic layer 14 formed on the antiferromagnetic layer 13 has a three layer structure.

The pinned magnetic layer 14 has the three layer structure, which is composed of a magnetic layer 14a, a nonmagnetic intermediate layer 14b, and a magnetic layer 14c. The directions of magnetization of the magnetic layer 14a and the magnetic layer 14c are in the mutually antiparallel state by the exchange coupling magnetic field at the interface between the antiferromagnetic layer 13 and the pinned magnetic layer, and the antiferromagnetic exchange coupling magnetic field (RKKY interaction) caused by the nonmagnetic intermediate layer 14b. This state is called as an artificial ferrimagnetic coupling state, and the pinned magnetic layer 14 can be stably magnetized by this structure. Furthermore, it is possible to increase the exchange coupling magnetic field, which is generated at the interface between the pinned magnetic layer and the antiferromagnetic layer 13.

However, the pinned magnetic layer 14 may have a monolayer structure made of a magnetic material, or a multilayer structure made of a magnetic material.

In addition, the magnetic layer 14a is formed so as to have a thickness of, for example, about 15 to 35 Å, the nonmagnetic intermediate layer 14b is formed so as to have a thickness of about 8 to 10 Å, and the magnetic layer 14a is formed so as to have a thickness of about 20 to 50 Å.

The nonmagnetic intermediate layer 14b is made of a nonmagnetic conductive material such as Ru, Rh, Ir, Cr, Re, and Cu.

Furthermore, it is preferable that the magnetic layer 14c of the pinned magnetic layer 14 be a $Co_2YZ$ alloy layer (Y is one or more elements of Mn, Fe, and Cr, and Z is one or more elements of Al, Ga, Si, Ge, Sn, In, Sb, Pb, and Zn). The $Co_2YZ$ alloy layer has the characteristic of a semimetal, and is an effective material to increase the product ΔRA of the magnetic resistance variation ΔR of a CPP (current perpendicular to the plane)-GMR magnetic detecting device and the area A of the device.

The nonmagnetic material layer 15 formed on the pinned magnetic layer 14 is made of Cu, Au, or Ag.

Moreover, the free magnetic layer 16 is formed on the nonmagnetic material layer. The structure of the free magnetic layer 16 will be described below.

In the embodiment shown in FIG. 1, hard bias layers 18 are formed on both sides of the free magnetic layer 16. The free magnetic layer 16 is uniformly magnetized in the track width direction (X direction in FIG. 1) by the longitudinal bias magnetic field, which is generated by the hard bias layers 18. Each of the hard bias layers 18 is made of, for example, a Co—Pt (cobalt-platinum) alloy, a Co—Cr—Pt (cobalt-chrome-platinum) alloy, or the like.

The upper and lower portions and end portions of the hard bias layers 18 are insulated with insulating layers 19 made of alumina or the like.

Electrode layers 20 are provided on the upper and lower sides of the multilayer film T1, respectively. Accordingly, a CPP-GMR magnetic detecting device in which a sense current flows in the direction perpendicular to the plane of each layer forming the multilayer film T1, is obtained.

Each of the electrode layers 20 is made of α-Ta, Au, Cr, Cu (copper), Rh, Ir, Ru, W (tungsten), or the like.

The characteristics of the present embodiment will be described.

The free magnetic layer 16 has the three layer structure in which a CoFe layer 16a, a $Ni_aFe_b$ alloy layer 16b (here, a and b are represented by at %, and satisfy the relationship of 47≦a≦77 and a+b=100), and a CoFe layer 16c are laminated in this order from the lower side.

The CoFe layer 16a and the CoFe layer 16c, which are laminated on the upper and lower sides of the $Ni_aFe_b$ alloy layer 16b, respectively, are provided to prevent the diffusion of the NiFe alloy and to reduce the magnetostriction of the entire free magnetic layer 16. Meanwhile, even though only the CoFe layer 16a being in contact with the nonmagnetic material layer 15 is provided in case of the single spin valve GMR magnetic detecting device shown in FIG. 1, it is possible to prevent the diffusion of the NiFe alloy into the nonmagnetic material layer 15 and to reduce the magnetostriction of the entire free magnetic layer 16. In addition, the CoFe layers 16a and 16c are not provided and the free magnetic layer 16 may have a single-layer structure that is composed of only the $Ni_aFe_b$ alloy layer 16b.

Further, it is preferable that the thickness t1 of the $Ni_aFe_b$ alloy layer 16b be in the range of 20 to 90 Å, and it is preferable that the thickness t2 of the CoFe layer 16a and the thickness t3 of the CoFe layer 16c be in the range of 3 to 15 Å.

In the spin valve thin film device shown in FIG. 1, after all layers from the base layer 11 to the protective layer 17 are laminated, a heat treatment is performed to generate the exchange coupling magnetic field at the interface between the antiferromagnetic layer 13 and the pinned magnetic layer 14. In this case, since the magnetic field is formed in the direction parallel to the Y direction in FIG. 1, the pinned magnetic layer 14 is magnetized in the direction parallel to the Y direction in FIG. 1. Furthermore, the pinned magnetic layer 14 has an artificial ferrimagnetic structure in the embodiment shown in FIG. 1. Accordingly, if the magnetic layer 14a is magnetized, for example, in the Y direction, the magnetic layer 14c and the magnetic layer 23 are magnetized in the direction reverse to the Y direction.

In the magnetic detecting device shown in FIG. 1, the pinned magnetic layer and the free magnetic layer are magnetized in the direction orthogonal to each other. The leak magnetic field from the magnetic recording medium is penetrated into the magnetic detecting device in the Y direction, and thus the direction of magnetization of the free magnetic layer is changed with high sensitivity. An electrical resistance value changes depending on the relation between the change of the direction of magnetization of the free magnetic layer and the direction of fixed magnetization of the pinned magnetic layer. Then, a voltage value and a current value change on the basis of the change of the electrical resistance value, and thus the leak magnetic field from the magnetic recording medium is detected.

Figure 2:
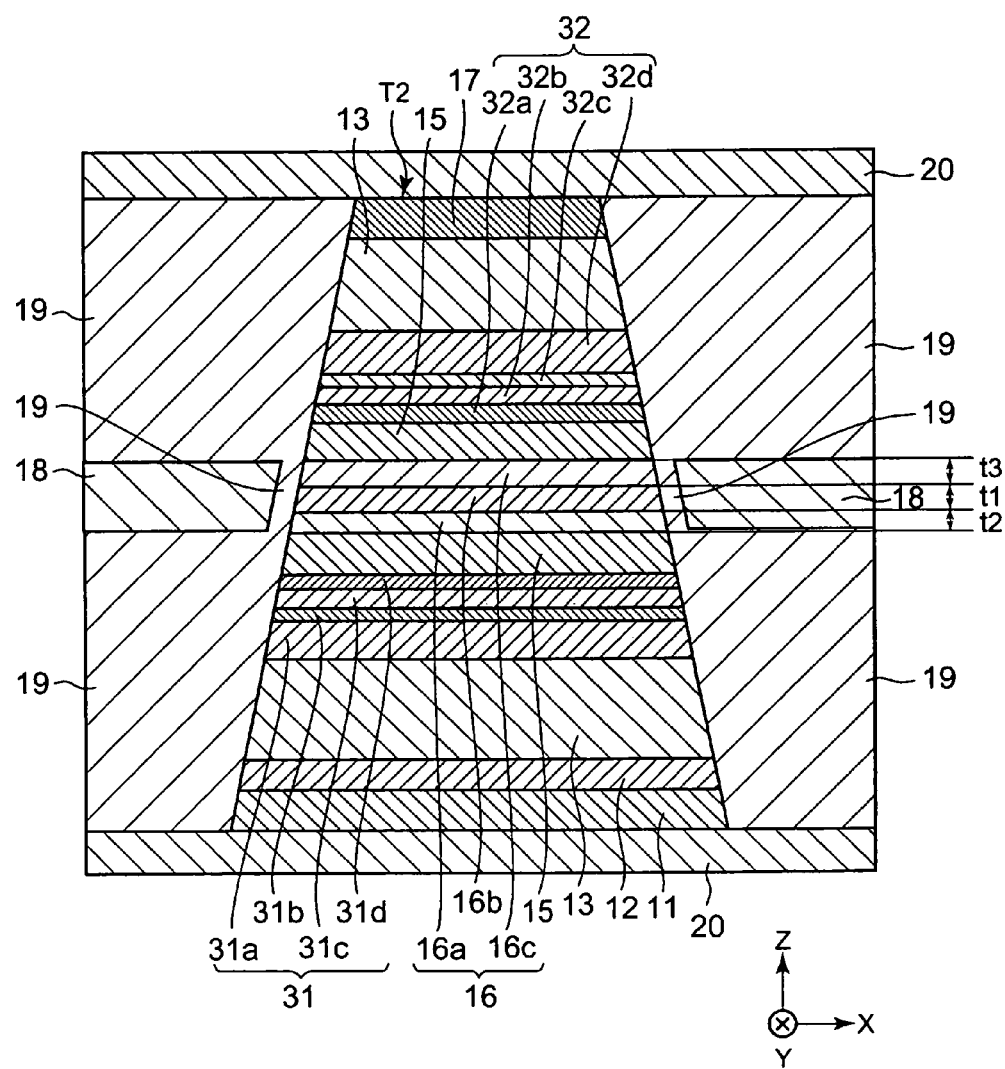
FIG. 2 is a cross-sectional view showing the structure of a magnetic detecting device (dual spin valve magnetoresistive sensor) according to a second embodiment of the invention as seen from the opposite side to a recording medium.

FIG. 2 is a partial cross-sectional view showing the structure of a dual spin valve magnetic detecting device according to the invention.

As shown in FIG. 2, a base layer 11, a seed layer 12, an antiferromagnetic layer 13, a pinned magnetic layer 31, a nonmagnetic material layer 15, and a free magnetic layer 16 are successively laminated from the lower side. In addition, a nonmagnetic material layer 15 and a pinned magnetic layer 32, an antiferromagnetic layer 13, and a protective layer 17 are successively laminated on the free magnetic layer 16 so as to form a multilayer film T2.

Furthermore, hard bias layers 18 are formed on both sides of the free magnetic layer 16. The hard bias layers 18 are insulated with insulating layers 19 made of alumina or the like.

Electrode layers 20 are provided on the upper and lower sides of the multilayer film T2, respectively. Accordingly, a CPP-GMR magnetic detecting device in which a sense current flows in the direction perpendicular to the plane of each layer forming the multilayer film T2, is obtained.

Moreover, in FIG. 2, layers indicated by the same reference numerals as those in FIG. 1 are made of the same materials as those of the layers in FIG. 1, respectively.

The pinned magnetic layer 31 of the magnetic detecting device shown in FIG. 2 has a four-layer structure, which is composed of a magnetic layer 31a, a nonmagnetic intermediate layer 31b, a magnetic layer 31c, and a heusler alloy layer 31d. Each of the magnetic layer 31a and the magnetic layer 31c is made of a ferromagnetic material such as CoFe, and the heusler alloy layer 31d is made of a heusler alloy to be described below. The heusler alloy layer 31d has a ferromagnetic property, and the magnetic layer 31c and the heusler alloy layer 31d are magnetized in the same direction with each other by a ferromagnetic coupling.

The direction of magnetization of the magnetic layer 31a, and the directions of magnetization of the magnetic layer 31c and the heusler alloy layer 31d are in the mutually antiparallel state by the exchange coupling magnetic field at the interface between the antiferromagnetic layer 13 and the pinned magnetic layer, and the antiferromagnetic exchange coupling magnetic field (RKKY interaction) caused by the nonmagnetic intermediate layer 31b.

The heusler alloy layer 31d is provided in the pinned magnetic layer 31 of the CPP-GMR magnetic detecting device, and a heusler alloy layer 32a is provided in the pinned magnetic layer 32. Accordingly, after and before the external magnetic field is applied to the device, the spin diffusion length or a variation of the mean free path of conduction electrons in the multilayer film T2 increase. That is, the variation of the resistance value of the multilayer film T2 increases, and the detection sensitivity for the external magnetic field improves. In addition, the heusler alloy layer may be laminated below the nonmagnetic intermediate layer 31b or above a nonmagnetic intermediate layer 32c. However, since layers being in contact with the nonmagnetic material layers 15 contribute to the magnetoresistance effect, it is effective that the heusler alloy layer is laminated above the nonmagnetic intermediate layer 31b or below the nonmagnetic intermediate layer 32c.

The heusler alloy layer 31d, which is one of the layers forming the pinned magnetic layer 31, is a $Co_2YZ$ alloy layer (Y is one or more elements of Mn, Fe, and Cr, and Z is one or more elements of Al, Ga, Si, Ge, Sn, In, Sb, Pb, and Zn). The $Co_2YZ$ alloy layer has the characteristic of a semimetal, and is an effective material to increase the product ΔRA of the magnetic resistance variation ΔR of a CPP-GMR magnetic detecting device and the area A of the device.

More preferably, the heusler alloy layer 31d is made of a metal complex having the composition formula represented by $Co_2MnZ$. Here, Z is one or more elements of Al, Ga, Si, Ge, Sn, In, Sb, Pb, and Zn.

The pinned magnetic layer 32 of the magnetic detecting device shown in FIG. 2 has a four-layer structure, which is composed of the heusler alloy layer 32a, a magnetic layer 32b, the nonmagnetic intermediate layer 32c, and a magnetic layer 32d. Each of the magnetic layer 32b and the magnetic layer 32d is made of a ferromagnetic material such as CoFe, and the heusler alloy layer 32a is made of a heusler alloy that is the same material as that of the heusler alloy layer 31d of the above-mentioned pinned magnetic layer 31. The magnetic layer 32b has a ferromagnetic property, and the heusler alloy layer 32a and the magnetic layer 32b are magnetized in the same direction with each other by a ferromagnetic coupling.

The direction of magnetization of the magnetic layer 32d, and the directions of magnetization of the heusler alloy layer 32a and the magnetic layer 32b are in the mutually antiparallel state by the exchange coupling magnetic field at the interface between the antiferromagnetic layer 13 formed on the pinned magnetic layer 32 and the pinned magnetic layer, and the antiferromagnetic exchange coupling magnetic field (RKKY interaction) caused by the nonmagnetic intermediate layer 32c.

Furthermore, each of the pinned magnetic layers 31 and 32 may not have an artificial ferrimagnetic structure. In addition, the pinned magnetic layer 31 shown in FIG. 2 may be used instead of the pinned magnetic layer 14 of the magnetic detecting device shown in FIG. 1.

In the present embodiment, the free magnetic layer 16 has the three layer structure in which a CoFe layer 16a, a $Ni_aFe_b$ alloy layer 16b (here, a and b are represented by at %, and satisfy the relationship of 47≦a≦77 and a+b=100), and a CoFe layer 16c are laminated in this order from the lower side.

The CoFe layer 16a and the CoFe layer 16c, which are laminated on the upper and lower sides of the $Ni_aFe_b$ alloy layer 16b, respectively, are provided to prevent the diffusion of the NiFe alloy and to reduce the magnetostriction of the entire free magnetic layer 16. Meanwhile, the CoFe layers 16a and 16c are not provided and the free magnetic layer 16 may have a single-layer structure, which is composed of only the $Ni_aFe_b$ alloy layer 16b.

Further, it is preferable that the thickness t1 of the $Ni_aFe_b$ alloy layer 16b be in the range of 20 to 90 Å, and it is preferable that the thickness t2 of the CoFe layer 16a and the thickness t3 of the CoFe layer 16c be in the range of 3 to 15 Å.

In the spin valve thin film device shown in FIG. 2, after all layers from the base layer 11 to the protective layer 17 are laminated, a heat treatment is performed to generate the exchange coupling magnetic field at the interfaces between the antiferromagnetic layer 13 and the pinned magnetic layers 31 and 32. In this case, since the magnetic field is formed in the direction parallel to the Y direction in FIG. 2, the pinned magnetic layers 31 and 32 are magnetized in the direction parallel to the Y direction in FIG. 2. Furthermore, each of the pinned magnetic layers 31 and 32 has an artificial ferrimagnetic structure in the embodiment shown in FIG. 2.

In the magnetic detecting device shown in FIG. 2, each of the pinned magnetic layer and the free magnetic layer are magnetized in the direction orthogonal to each other. The leak magnetic field from the magnetic recording medium is penetrated into the magnetic detecting device in the Y direction, and thus the direction of magnetization of the free magnetic layer is changed with high sensitivity. An electrical resistance value changes depending on the relation between the change of the directions of magnetization of the free magnetic layer and the direction of fixed magnetization of each pinned magnetic layer. Then, a voltage value and a current value change on the basis of the change of the electrical resistance value, and thus the leak magnetic field from the magnetic recording medium is detected. In the dual spin valve magnetic detecting device, the pinned magnetic layers 31 and 32 are provided above and below the free magnetic layer 16 with the nonmagnetic material layers 15 therebetween, respectively. Accordingly, the product ΔRA of the magnetic resistance variation ΔR and the area A of the device can be theoretically increased twice as large as the product in the spin valve magnetic detecting device shown in FIG. 1. According to the magnetic detecting device of the present embodiment, the ΔRA of the magnetic detecting device can have a value of 5 mΩμm² or more.

Figure 3:
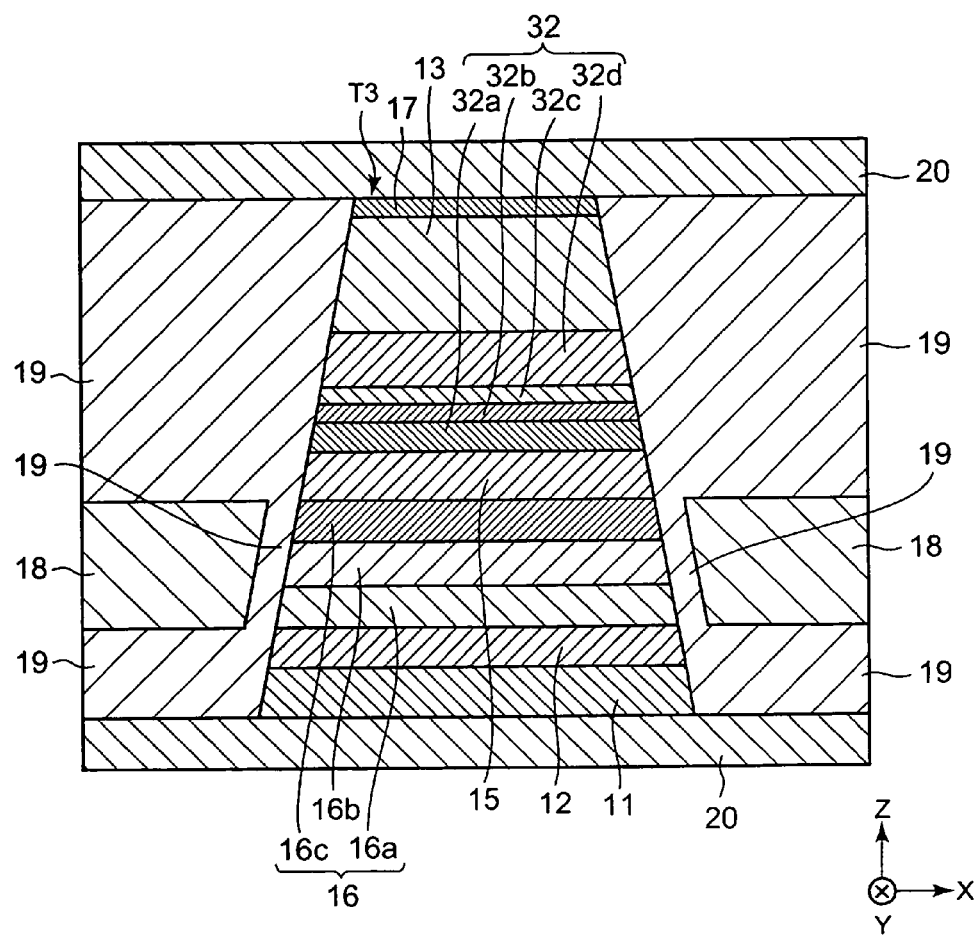
FIG. 3 is a cross-sectional view showing the structure of a magnetic detecting device (single spin valve magnetoresistive sensor) according to a third embodiment of the invention as seen from the opposite side to a recording medium.

FIG. 3 is a partial cross-sectional view showing the structure of a top spin valve magnetic detecting device according to the invention.

As shown in FIG. 3, a base layer 11, a seed layer 12, a free magnetic layer 16, a nonmagnetic material layer 15, a pinned magnetic layer 32, an antiferromagnetic layer 13, and a protective layer 17 are successively laminated so as to form a multilayer film T3.

Furthermore, hard bias layers 18 are formed on both sides of the free magnetic layer 16. The hard bias layers 18 are insulated with insulating layers 19 made of alumina or the like.

Electrode layers 20 are provided on the upper and lower sides of the multilayer film T3, respectively. Accordingly, a CPP-GMR magnetic detecting device in which a sense current flows in the direction perpendicular to the plane of each layer forming the multilayer film T3, is obtained.

Moreover, in FIG. 3, layers indicated by the same reference numerals as those in FIG. 1 or 2 are made of the same materials as those of the layers in FIG. 1 or 2, respectively.

In the present embodiment, the free magnetic layer 16 has the three layer structure in which a CoFe layer 16a, a $Ni_aFe_b$ alloy layer 16b (here, a and b are represented by at %, and satisfy the relationship of $47 \leq a \leq 77$ and a+b=100), and a CoFe layer 16c are laminated in this order from the lower side.

Furthermore, in FIGS. 1 to 3, the directions of magnetization of the pinned magnetic layers 14, 31, and 32 are fixed by the exchange coupling magnetic fields at the interface between the antiferromagnetic layer 13 and the pinned magnetic layers 14, 31, and 32. However, each of the pinned magnetic layers 14, 31, and 32 may have a self-pinned structure in which the antiferromagnetic layer 13 does not overlap the pinned magnetic layers 14, 31, and 32, and the directions of magnetization of the pinned magnetic layers 14, 31, and 32 are fixed by the uniaxial anisotropy of the pinned magnetic layers 14, 31, and 32.

FIRST EXAMPLE

When the dual spin valve magnetic detecting device to be described below is provided and the content of Ni (represented by at %) in a $Ni_aFe_b$ alloy layer (here, a and b are represented by at %, and satisfy the relationship of a+b=100) forming a free magnetic layer is changed, the product ΔRA of the magnetic resistance variation ΔR of the magnetic detecting device and the area A of the device is measured. In addition, a product ΔRA in the magnetic detecting device according to an example, and a product ΔRA in the magnetic detecting device according to a comparative example are measured and compared with each other. In the example, each of the second pinned magnetic layers (corresponding to the magnetic layer 31c and the heusler alloy layer 31d, and the heusler alloy layer 32a and the magnetic layer 32b in FIG. 2) is made of a $Co_2MnGe$ alloy. In the comparative example, each of the second pinned magnetic layers is made of only a CoFe alloy.

The example: substrate/base layer Ta (30 Å)/seed layer NiFeCr (50 Å)/antiferromagnetic layer IrMn (70 Å)/pinned magnetic layers (first pinned magnetic layer $Co_{70}Fe_{30}$ (30 Å)/nonmagnetic intermediate layer Ru (9.1 Å)/second pinned magnetic layer CoFe (10 Å)/$Co_2MnGe$ (40 Å))/nonmagnetic material layer Cu (43 Å)/free magnetic layer CoFe (5 Å)/$Ni_aFe_b$ (90 Å)/CoFe (5 Å)/nonmagnetic material layer Cu (43 Å)/second pinned magnetic layer ($Co_2MnGe$ (40 Å)/CoFe (10 Å)/nonmagnetic intermediate layer Ru (9.1 Å)/first pinned magnetic layer ($Co_{70}Fe_{30}$ (30 Å))/antiferromagnetic layer IrMn (70 Å)/protective layer Ta (200 Å). Here, a number in a parenthesis is a thickness value of each layer.

The comparative example: substrate/base layer Ta (30 Å)/seed layer NiFeCr (50 Å)/antiferromagnetic layer IrMn (70 Å)/pinned magnetic layers (first pinned magnetic layer $Co_{70}Fe_{30}$ (30 Å)/nonmagnetic intermediate layer Ru (9.1 Å)/second pinned magnetic layer CoFe (50 Å)/nonmagnetic material layer Cu (43 Å)/free magnetic layer CoFe (5 Å)/$Ni_aFe_b$ (90 Å)/CoFe (5 Å)/nonmagnetic material layer Cu (43 Å)/second pinned magnetic layer (CoFe (50 Å))/nonmagnetic intermediate layer Ru (9.1 Å)/first pinned magnetic layer ($Co_{70}Fe_{30}$ (30 Å))/antiferromagnetic layer IrMn (70 Å)/protective layer Ta (200 Å). Here, a number in a parenthesis is a thickness value of each layer.

Figure 4:
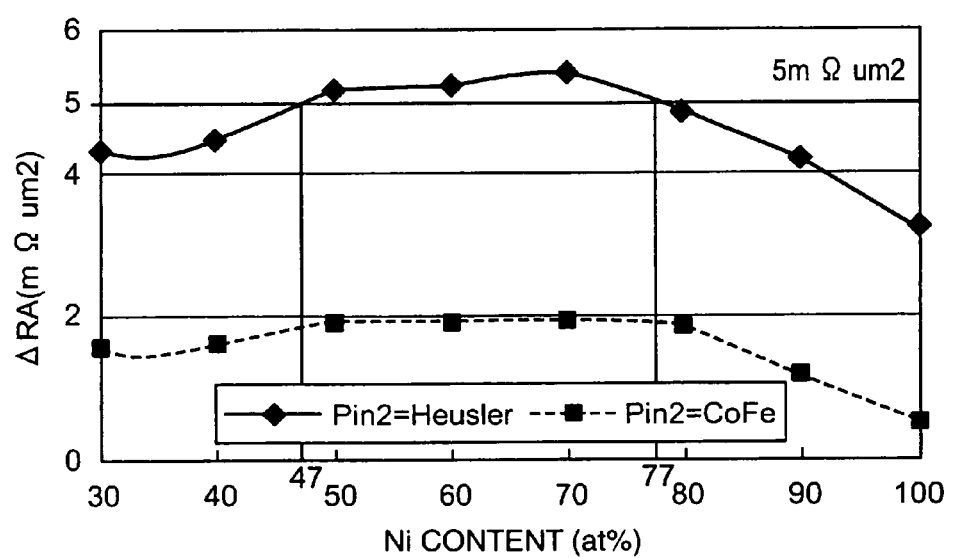
FIG. 4 is a graph showing the product $\Delta RA$ of the magnetic resistance variation $\Delta R$ of the magnetic detecting device and the area $A$ of the device when the dual spin valve magnetic detecting device is provided and the content of Ni (represented by at %) in a $Ni_aFe_b$ alloy layer (here, a and b are represented by at %, and satisfy the relationship of $a+b=100$) forming a free magnetic layer is changed.
Figure 5:
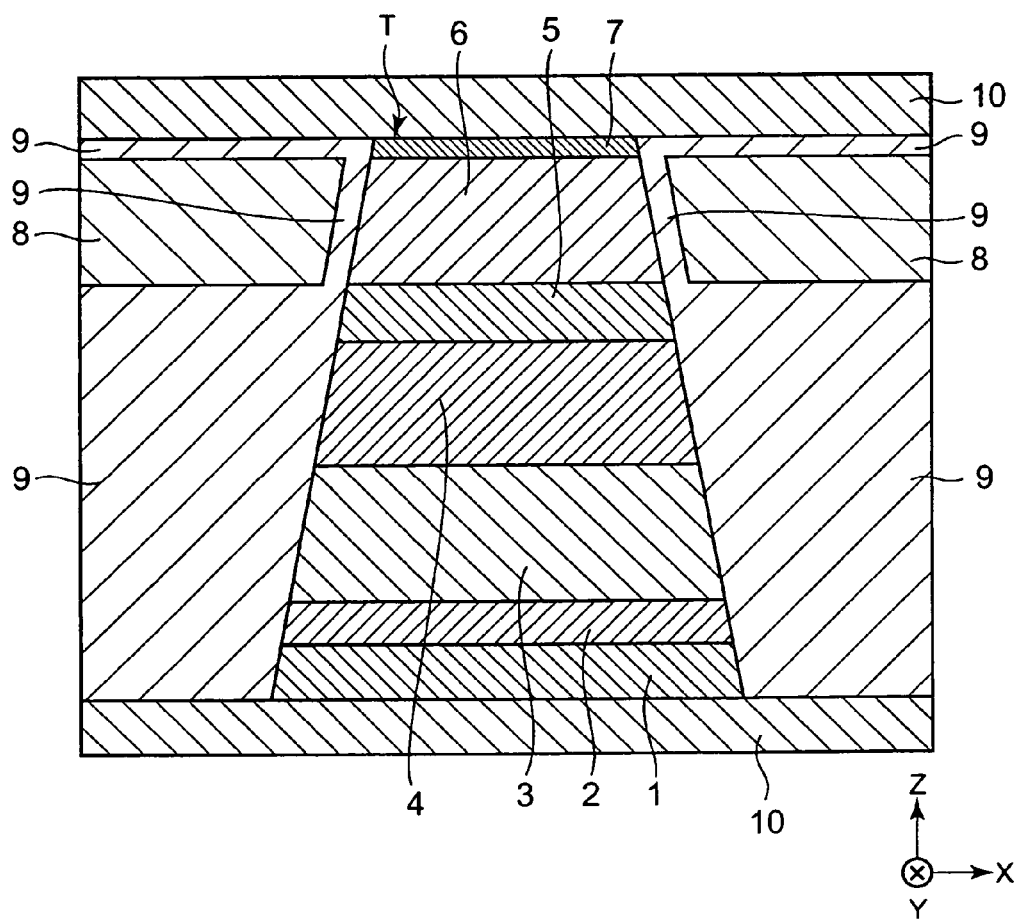
FIG. 5 is a cross-sectional view showing a conventional magnetic detecting device.

The results are shown in FIG. 4. In the magnetic detecting device according to the example in which each of the second pinned magnetic layers includes a layer made of a $Co_2MnGe$ alloy, when the content a of Ni in the $Ni_aFe_b$ alloy layer (here, a and b are represented by at %, and satisfy the relationship of a+b=100) is in the range of 17 to 77 at %, the ΔRA of the magnetic detecting device has a value of 5 mΩμm² or more.

Meanwhile, in the magnetic detecting device according to the comparative example in which each of second pinned magnetic layers is made of a CoFe alloy, the maximum ΔRA of the magnetic detecting device has a value of 2 mΩμm² or less, and the regenerated output thereof only has a value lower than the half of that of the magnetic detecting device according to the example.

In the conventional CPP-GMR magnetic detecting device, the ΔRA of the magnetic detecting device cannot have a value of 5 mΩμm² or more. Furthermore, in the CIP-GMR magnetic detecting device that has been put to practical use so far, it has been not possible to obtain the regenerated output corresponding to the CPP-GMR magnetic detecting device having a ΔRA value of 5 mΩμm² or more.

In contrast, the CPP-GMR magnetic detecting device according to the example can have a ΔRA value of 5 mΩμm² or more. That is, in the magnetic detecting device according to the example, it is possible to obtain a larger and more practical regenerated output than in the conventional CPP-GMR magnetic detecting device or the CIP-GMR magnetic detecting device.

The invention claimed is:

1. A magnetic detecting device comprising:
   a multilayer film, which has at least one pinned magnetic layer magnetized in one direction and a free magnetic layer formed on the pinned magnetic layer with a nonmagnetic material layer therebetween, and in which a sense current flows in the direction perpendicular to the plane of each layer forming the multilayer film,
   wherein the free magnetic layer includes a $Ni_aFe_b$ alloy layer (a and b are represented by at %, and satisfy the relationship of $47 \leq a \leq 77$ and a+b=100),
   the pinned magnetic layer includes a $Co_2YZ$ alloy layer (Y is one or more elements of Mn, Fe, and Cr, and Z is one or more elements of Al, Ga, Si, Ge, Sn, In, Sb, Pb, and Zn), and
   wherein the $Co_2YZ$ alloy has a Heusler structure.

2. The magnetic detecting device according to claim 1, wherein a product ΔRA of a resistance variation and an area of the device has a value of 5 mΩ/μm² or more.

3. The magnetic detecting device according to claim 1, wherein the free magnetic layer has a three layer structure in which CoFe layers are laminated on the upper and lower sides of the $Ni_aFe_b$ alloy layer, respectively.

4. The magnetic detecting device according to claim 1, wherein the pinned magnetic layer is provided above the free magnetic layer.

5. The magnetic detecting device according to claim 1, wherein the pinned magnetic layer is provided below the free magnetic layer.

6. The magnetic detecting device according to claim 1, wherein the nonmagnetic material layer and the pinned magnetic layer are provided below the free magnetic layer, and another nonmagnetic material layer and another pinned magnetic layer are also provided above the free magnetic layer.

7. The magnetic detecting device according to claim 4, wherein an antiferromagnetic layer overlaps the pinned magnetic layer.

* * * * *